(12) United States Patent
Ohno (10) Patent No.: US 11,502,011 B2
(45) Date of Patent: *Nov. 15, 2022

(54) SEMICONDUCTOR MODULE AND SEMICONDUCTOR DEVICE CONTAINER

(71) Applicant: SUMITOMO ELECTRIC DEVICE INNOVATIONS, INC., Kanagawa (JP)

(72) Inventor: Tomoki Ohno, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 20 days.

This patent is subject to a terminal disclaimer.

(21) Appl. No.: 17/169,011

(22) Filed: Feb. 5, 2021

(65) Prior Publication Data

US 2021/0159132 A1    May 27, 2021

Related U.S. Application Data

(63) Continuation of application No. 16/786,487, filed on Feb. 10, 2020, now Pat. No. 10,957,613.

(30) Foreign Application Priority Data

Feb. 12, 2019 (JP) .............................. JP2019-022410

(51) Int. Cl.
*H01L 23/13* (2006.01)
*H01L 23/492* (2006.01)
*H01L 23/14* (2006.01)
*H01L 23/15* (2006.01)
*H01L 23/495* (2006.01)

(52) U.S. Cl.
CPC ............ *H01L 23/13* (2013.01); *H01L 23/145* (2013.01); *H01L 23/15* (2013.01); *H01L 23/492* (2013.01); *H01L 23/49524* (2013.01)

(58) Field of Classification Search
CPC ....... H01L 23/13; H01L 23/145; H01L 23/15; H01L 23/492; H01L 23/49524
See application file for complete search history.

(56) References Cited

U.S. PATENT DOCUMENTS

| 2012/0001309 | A1* | 1/2012 | Soyano | ................... H01L 23/10 257/E23.051 |
| 2012/0025361 | A1 | 2/2012 | Ito | |
| 2016/0254215 | A1 | 9/2016 | Sato | |
| 2018/0033761 | A1 | 2/2018 | Watanabe | |

FOREIGN PATENT DOCUMENTS

JP        H10-163353        6/1998

* cited by examiner

*Primary Examiner* — Peniel M Gumedzoe (74) *Attorney, Agent, or Firm* — Smith, Gambrell & Russell, LLP.

(57) ABSTRACT

A semiconductor module includes a base plate made of a metal, an insulating frame provided on a peripheral edge portion of the base plate, a lead made of a metal and provided on the frame, and a semiconductor device mounted on the base plate in a space surrounded by the frame, wherein the frame is fixed to the base plate by a bonding material containing silver, the frame has concave portions formed in an inner portion which is a corner portion on a space side and an outer portion which is a corner portion on a side opposite to the inner portion in a surface thereof which faces the base plate, and the concave portions are filled with a coating material.

14 Claims, 8 Drawing Sheets

SEMICONDUCTOR MODULE AND SEMICONDUCTOR DEVICE CONTAINER

CROSS-REFERENCE TO RELATED APPLICATIONS

This application is a continuation of U.S. application Ser. No. 16/786,487 filed on Feb. 10, 2020, which claims priority from Japanese Patent Application 2019-022410 filed on Feb. 12, 2019. Both such predecessor applications are incorporated by reference herein.

BACKGROUND OF THE INVENTION

1. Field of the Invention

The disclosure relates to a semiconductor module and a semiconductor device container.

2. Background Arts

Conventionally, a configuration which includes a base made of a metal, an insulating frame provided on the base, and a lead terminal provided on the frame and in which a semiconductor device is mounted in an opening portion of the frame is known as a semiconductor module (for example, refer to Japanese Unexamined Patent Publication No. H10-163353).

In the semiconductor module described above, a frame is fixed to the base by, for example, a solder containing silver. In such a configuration, when an electric field is present between a lead and the base, especially in high humidity, ion migration in which an ionized metal moves on a surface of a substance in the electric field occurs. When ion migration occurs, and metal ions which have been moved by the electric field return to a metal from the ionized state for some reason, the metal is accumulated, and thus dendrites (dendritic crystals) may be generated. When the dendrites grow, a short circuit occurs between electrodes, and there is a possibility that a circuit or a semiconductor may be eventually destroyed.

Therefore, one aspect of the disclosure is to curb occurrence of ion migration.

SUMMARY OF THE INVENTION

A semiconductor module according to one aspect of the disclosure includes a base made of a metal, an insulating frame provided on a peripheral edge portion of the base, a lead made of a metal and provided on the frame, and a semiconductor chip mounted on the base in a space surrounded by the frame, wherein the frame is fixed to the base by a bonding material containing silver, the frame has concave portions formed in an inner portion which is a corner portion on a space side and an outer portion which is a corner portion on a side opposite to the inner portion in a surface thereof which faces the base, and at least one of the concave portions in the outer portion and the inner portion is filled with a protective material.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

A specific example of a semiconductor module according to an embodiment of the present invention will be described below with reference to the drawings. In the description, the same elements or elements having the same functions will be designated by the same reference numerals, and redundant description will be omitted. The present invention is not limited to the following examples but is indicated by the appended claims and is intended to include any modifications within the scope and meaning equivalent to the appended claims.

Figure 1:
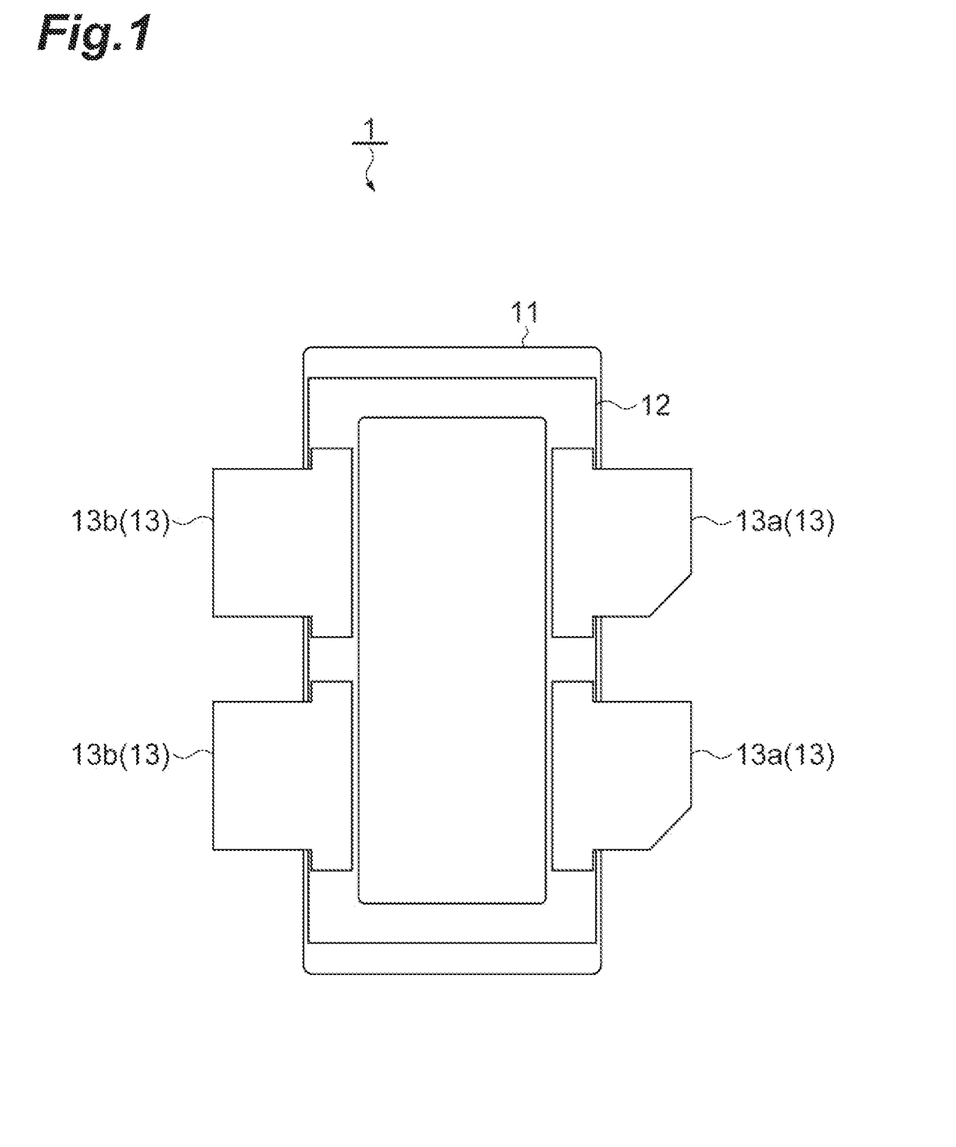
FIG. 1 is a plan view showing a semiconductor module according to one aspect of the disclosure.

FIG. 1 is a plan view showing a semiconductor module 1 according to an embodiment. In FIG. 1, illustration of a semiconductor device 14 (refer to FIG. 2 and the like) included in the semiconductor module 1 is omitted. The semiconductor module 1 is a high-power high-frequency semiconductor package including the semiconductor device 14 configured of a nitride semiconductor. As shown in FIG. 1, the semiconductor module 1 includes a base plate 11 (a base), a frame 12, leads 13, and the semiconductor device 14 (refer to FIG. 2). The configuration including the base plate 11, the frame 12, and the leads 13 is a container of the semiconductor device 14 (a semiconductor device container).

Figure 2:
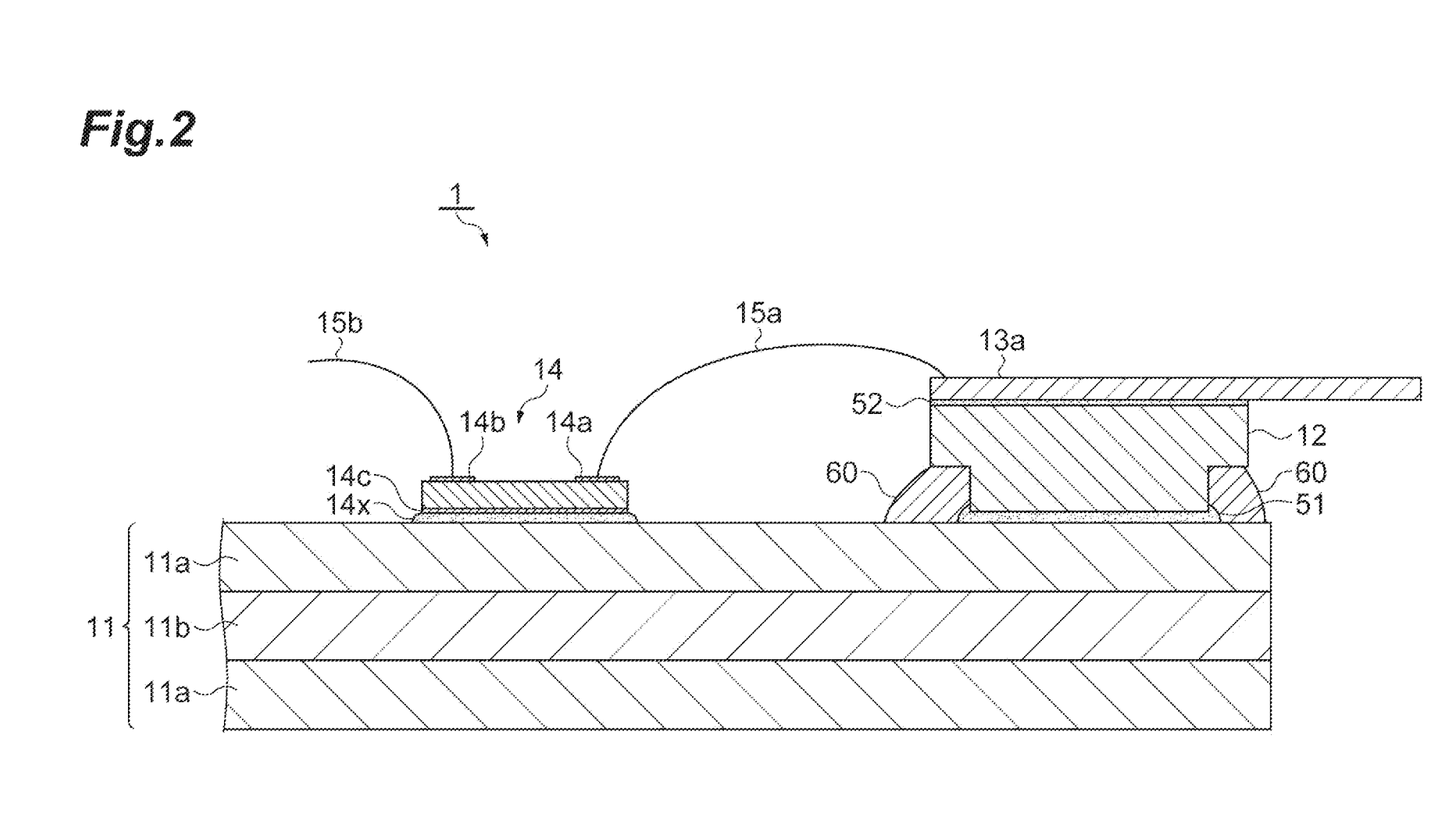
FIG. 2 is a cross-sectional view of the semiconductor module shown in FIG. 1.

The base plate 11 is a metal plate having copper, a copper alloy, or a laminated structure thereof and is formed in a rectangular shape in a plan view. As shown in FIG. 2, the base plate 11 has a laminated structure in which, for example, copper 11a, molybdenum 11b, and copper 11a are laminated. The thicknesses of the copper 11a, molybdenum 11b and copper 11a layers are, for example, about 0.2 mm, 0.3 mm, and 0.2 mm, respectively. The base plate 11 is entirely plated with gold, and the semiconductor device 14 is die-bonded with, for example, gold and tin (AuSn), an alloy of gold and silicon (AuSi), or the like. A thickness of the gold plating is, for example, about 0.2 μm. The base plate 11 is electrically at a ground potential.

The frame 12 is an insulating member provided on a peripheral edge portion of the base plate 11. As shown in FIG. 1, the frame 12 is provided along an edge of the rectangular base plate 11 and is not provided on a center portion of the base plate 11. The semiconductor device 14 is provided in a region (the center portion) of the base plate 11 in which the frame 12 is not provided (refer to FIG. 2). That is, the frame 12 surrounds the semiconductor device 14. The frame 12 holds the leads 13 insulated from the base plate 11.

The frame 12 is made of, for example, a ceramic. Specific examples include an aluminum oxide and an aluminum nitride. A thickness of the frame 12 is, for example, about 0.5 mm, and a width thereof is, for example, about 1.5 mm. Also, the width of the frame 12 is a length of a portion (four portions in the example of FIG. 1) in which the lead 13 is bonded in the extending direction of the lead 13. A portion of the frame 12 on the front surface side in which the lead 13 is bonded and an entire surface thereof on the back surface side are formed by metalizing tungsten which is then plated with nickel. The back surface side of the frame 12 may be intermittently plated with nickel instead of the entire surface. The back surface (a lower surface) of the frame 12 is fixed to the base plate 11 by a bonding material 51 containing silver (a silver-based bonding material) (refer to FIG. 2). Further, the leads 13 are fixed to a surface (an upper surface) of the frame 12 via a bonding material 52 containing silver (the silver-based bonding material) (refer to FIG. 2). The bonding materials 51 and 52 are, for example, AgCu solder or the like.

Figure 3:
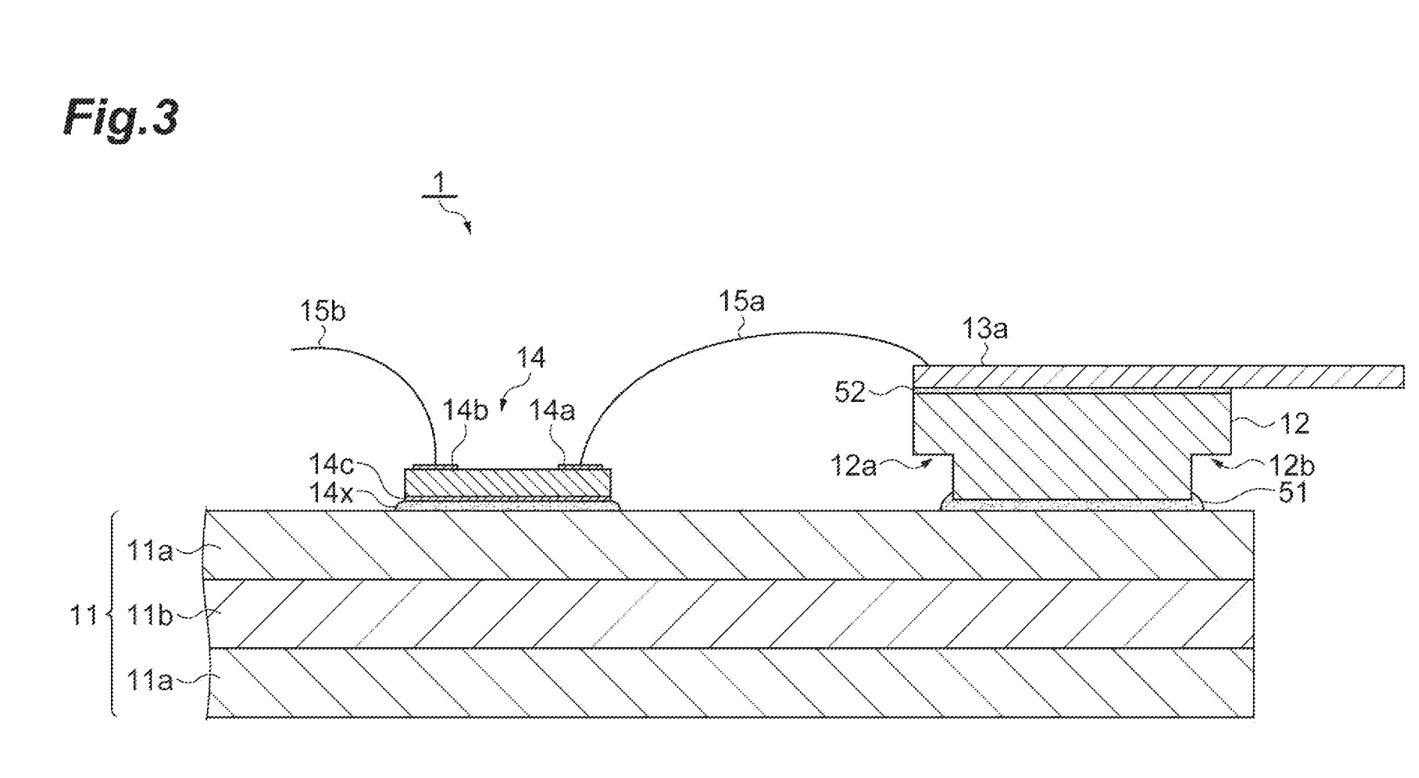
FIG. 3 is a cross-sectional view of the semiconductor module before it is filled with a coating material.
Figure 4:
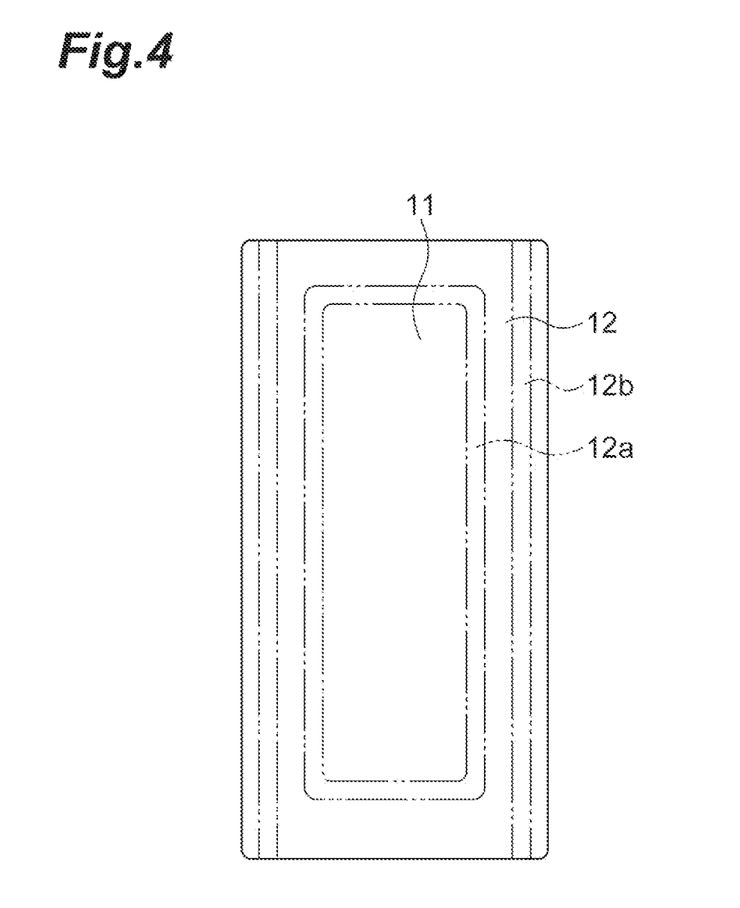
FIG. 4 is a view schematically showing a region in which a concave portion is formed in a frame.

FIG. 3 is a cross-sectional view of the semiconductor module 1 before it is filled with a coating material 60 (which will be described later). As shown in FIG. 3, the frame 12 has concave portions 12a and 12b at corner portions of a surface (the back surface) which faces the base plate 11. The surface of the frame 12 which faces the base plate 11 is formed in a stepped shape due to the formation of the concave portions 12a and 12b. The corner portions are both end portions of the frame 12 in a width direction and are an inner portion which is a corner portion on the space side which surrounds the semiconductor device 14 and an outer portion which is a corner portion opposite to the inner portion. The concave portion 12a has a concave shape formed in the inner portion. The concave portion 12b has a concave shape formed in an outer portion. The concave portions 12a and 12b have the same shape and size (dimension). A depth of the concave portions 12a and 12b (a length toward a center of the frame 12 in the width direction) is, for example, 0.05 mm or more and 0.5 mm or less. A height of the concave portions 12a and 12b (a recessed length from the surface which faces the base plate 11) is, for example, 0.05 mm or more and 0.5 mm or less. FIG. 4 is a view schematically showing a region in which the concave portions 12a and 12b are formed in the frame 12. In FIG. 4, a region surrounded by a two-dot chain line indicates a region in which the concave portions 12a and 12b are formed. As shown in FIG. 4, the concave portions 12a and 12b are formed along substantially the longitudinally entire region of the frame 12 in a longitudinal direction of the frame 12. That is, in the embodiment, the concave portions 12a and 12b are not limited to portions which overlap the leads 13 in a stacking direction and are formed over substantially the entire region of the frame 12 in the longitudinal direction.

The frame 12 may be configured, for example, to include a resin (or to be made of a resin) instead of a ceramic. Specifically, a polyimide resin and an epoxy resin may be exemplified. That is, the frame 12 may be formed of, for example, a resin substrate (a printed wiring board). A thickness of the frame 12 made of a resin substrate is, for example, about 0.5 mm, a width thereof is, for example, about 0.15 mm, and a specific material is, for example, a glass epoxy substrate. A printed wiring pattern is provided on the upper and lower surfaces (the front and back surfaces) of such a frame 12. The printed wiring pattern on the front surface (the upper surface) is bonded to the lead 13. The printed wiring pattern on the back surface (the lower surface) is bonded to the base plate 11. Also in the frame 12 formed of a resin substrate, a silver-based bonding material is used as the bonding materials 51 and 52 used for bonding.

For example, when the bonding is performed with a lead-free solder, the solder may be melted in a reflow process when the semiconductor module 1 is mounted on a mounting substrate or the like, and terminals may be separated. In addition, for example, since a resin adhesive is mainly scientifically bonded to a bonding surface, the adhesion of the base plate 11 to the gold plating is extremely poor. Therefore, a silver-based bonding material is used from the viewpoint of bonding reliability. The silver-based bonding material is, for example, a paste (a sintered nano-silver paste) including a silver filler having an extremely small particle size and a solvent. Since this causes a phenomenon in which the fine silver filler is activated and is melted at a low temperature, and becomes a metallic bond between gold and silver, strength and long-term reliability are excellent.

FIG. 2 is a cross-sectional view of the semiconductor module 1 shown in FIG. 1. As shown in FIG. 2, the above-described concave portions 12a and 12b (refer to FIG. 3) are filled with a coating material 60 (a protective material). Also, it is not necessary for both of the concave portions 12a and 12b to be filled with the coating material 60, and at least one of the concave portions 12a and 12b is filled with the coating material 60. The coating material 60 is stored in the concave portions 12a and 12b. The coating material 60 is filled in the concave portions 12a and 12b, thereby physically pressing down a surface of the bonding material 51 which is a silver-based bonding material and curbing occurrence of ion migration (which will be described later in detail). The coating material 60 is applied along the steps of the concave portions 12a and 12b, flows into the concave portions 12a and 12b by a capillary phenomenon and covers the insides of the concave portions 12a and 12b. It is preferable that the coating material 60 not expose the bonding material 51, but the coating material 60 may be filled in the concave portions 12a and 12b, for example, in a state in which a part of the bonding material 51 is exposed.

The coating material 60 is, for example, a resin of a thermoplastic insulating material. Specifically, a cycloolefin polymer-based resin, an epoxy-based resin, and the like can be used. The coating material 60 can be easily applied and cured around the frame 12 using a thermoplastic material as the coating material 60. The coating material 60 preferably has a low dielectric constant in consideration of use in a package of a high-frequency semiconductor device. For example, it is possible to appropriately curb an influence on high-frequency characteristics using the coating material 60 having a dielectric constant ($\varepsilon$) of 3.4 or more and 4.0 or less. Further, curing can be easily performed using the coating material 60 having a curing temperature of 150° C. or more and 230° C. or less.

The semiconductor device 14 (a semiconductor chip) is a semiconductor device such as an LDMOS, a GaN-HEMT, or a GaAs-FET. The semiconductor device 14 is mounted on the base plate 11 in a space surrounded by the frame 12. As shown in FIG. 2, the semiconductor device 14 has a gate electrode 14a and a drain electrode 14b on a front surface (an upper surface). Further, the semiconductor device 14 has a source electrode 14c on a back surface (a lower surface) thereof. The gate electrode 14a is connected to a gate lead 13a of the lead 13 via a bonding wire 15a (refer to FIG. 2). The drain electrode 14b is connected to a drain lead 13b (refer to FIG. 1) of the lead 13 via a bonding wire 15b (refer to FIG. 2). The semiconductor device 14 has a die bonding material 14x applied to the back surface thereof and is bonded to the base plate 11 by the die bonding material 14x. The die bonding material 14x is, for example, an alloy of gold and tin or silicon (AuSn, AuSi) or the like. The semiconductor device 14 may be, for example, a semiconductor device such as a bipolar transistor having a base electrode and a collector electrode.

The lead 13 is a metal member provided on the frame 12. The lead 13 is a thin metal plate containing, for example, copper, a copper alloy, and an iron alloy. A thickness of the lead 13 is, for example, about 0.1 mm, and a length (a length in an extending direction) of the lead 13 is, for example, about 3 mm. The lead 13 is an electrode for inputting or outputting a high-frequency signal and is connected to an input or output of the semiconductor device 14 inside the package. The lead 13 applies a bias voltage to the input of the semiconductor device 14 or supplies a power supply voltage to the output. As shown in FIG. 1, the lead 13 has two gate leads 13a and 13a and two drain leads 13b and 13b. The gate leads 13a and 13a and the drain leads 13b and 13b face each other in the extending direction of the leads 13. That is, the gate leads 13a and 13a and the drain leads 13b and 13b face each other with the semiconductor device 14 provided in the space surrounded by the frame 12 interposed therebetween. As shown in FIG. 2, the gate lead 13a is connected to the gate electrode 14a of the semiconductor device 14 via the bonding wire 15a. The drain lead 13b is connected to the drain electrode 14b of the semiconductor device 14 via the bonding wire 15b.

Figure 8:
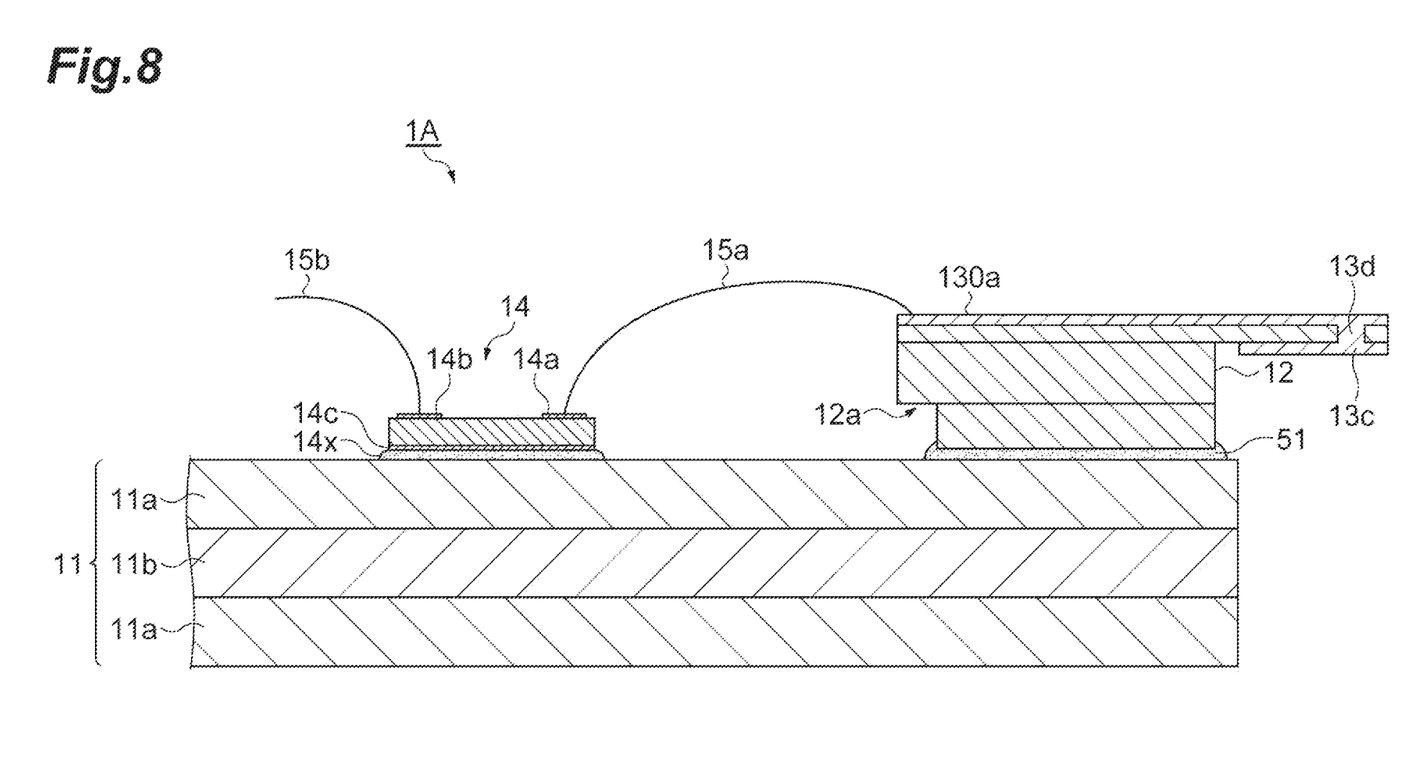
FIG. 8 is a cross-sectional view of a semiconductor module having another type of frame.

As another form of the lead 13, in a semiconductor module 1A shown in FIG. 8, the frame 12 is configured with a multilayer substrate, only the uppermost layer of the multilayer substrate is drawn out of the package, and a metal wiring pattern 130a formed on a surface of the uppermost layer (a surface opposite to the base) can be provided. Since only the uppermost layer is provided, flexibility is provided, and a portion drawn out of the package can be a so-called flexible printed board having the wiring pattern 130a on a surface thereof. A metal pattern 13c is also provided on a back surface of the uppermost layer in the outer portion, the front surface and the metal pattern 13c on the back surface side are made conductive through a via hole 13d provided in the outer portion, and the metal pattern 13c on the back surface side can be soldered to an external mounting substrate. In this case, since a distance between the metal pattern 13c provided on the back surface of the uppermost layer and the bonding material 51 can be increased, the concave portion 12b provided outside the frame 12 can be omitted.

Next, the operation and effects of the semiconductor module 1 according to the embodiment will be described in comparison with a comparative example.

Figure 5:
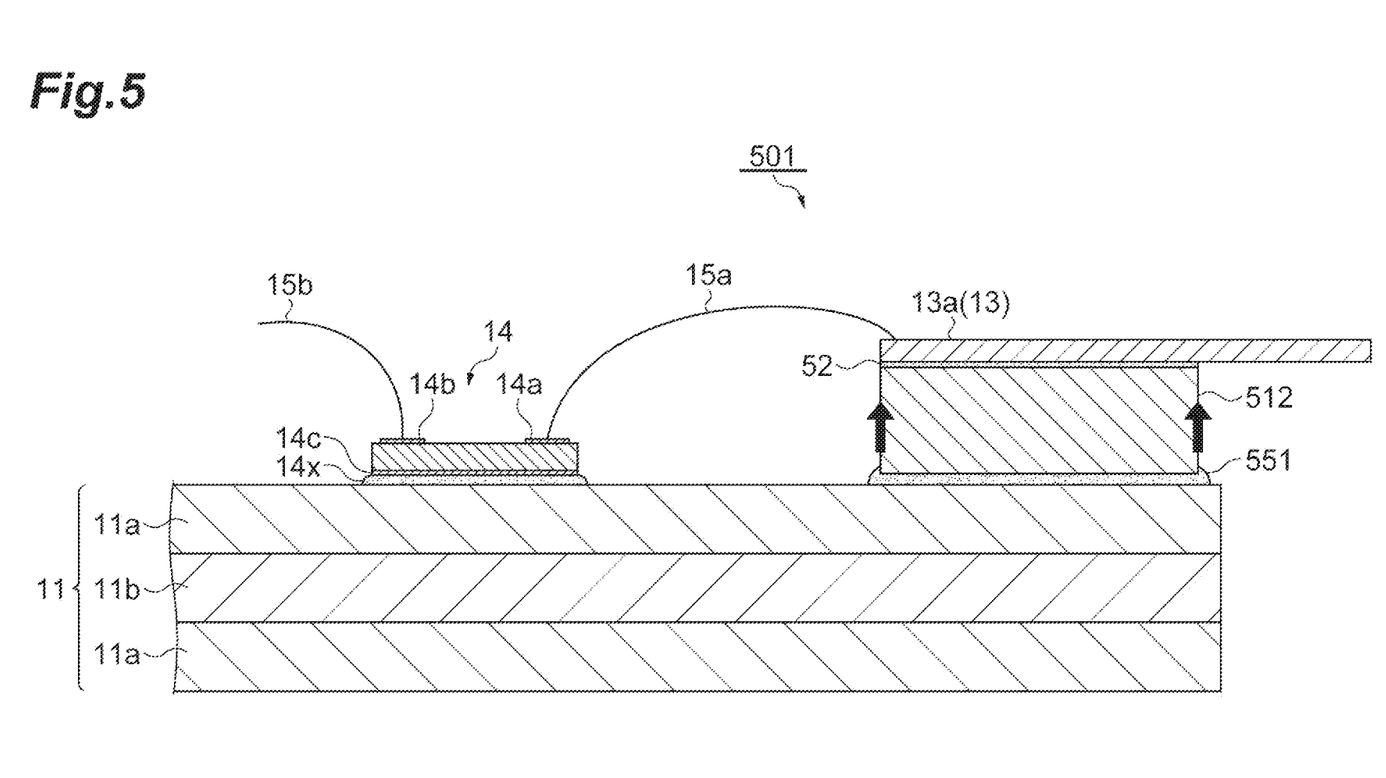
FIG. 5 is a cross-sectional view of a semiconductor module according to a comparative example.

FIG. 5 is a cross-sectional view of a semiconductor module 501 according to a comparative example. The semiconductor module 501 according to the comparative example includes a base plate 11, a frame 512, leads 13, and a semiconductor device 14. The configuration of the base plate 11, the leads 13, and the semiconductor device 14 is the same as that of the semiconductor module 1 according to the above-described embodiment. The frame 512 of the semiconductor module 501 is different from the frame 12 of the semiconductor module 1 in that it does not have the concave portion (the stepped shape) at the corner portion. Further, in the semiconductor module 501, no coating material is used.

Here, in the semiconductor module 501, the frame 512 is fixed to the base plate 11 with a bonding material 551 containing silver (a silver-based bonding material). In such a configuration, when an electric field is present between the lead 13 and the base plate 11, in particular, in the case of high humidity, the ion migration in which an ionized metal moves on a surface of a substance in the electric field occurs. When the ion migration occurs, and metal ions which have been moved by the electric field return to a metal from the ionized state for some reason, the metal is accumulated, and thus dendrites (dendritic crystals) may be generated. When the dendrites grow, a short circuit occurs between electrodes, and there is a possibility that a circuit or a semiconductor may be eventually destroyed. In the ion migration of silver, dendrites grow from a higher potential side to a lower potential side. For example, when the semiconductor device included in the semiconductor module 501 is a Gan-HEMT, and the lead 13 is electrically connected to the gate electrode, since a potential of the lead 13 is negative, silver of the bonding material 551 on the base plate 11 side grows to the lead 13 side. Conversely, when the lead 13 is electrically connected to the drain electrode, since the potential of the lead 13 is positive, the silver of the bonding material on the lead 13 side grows to the base plate 11 side. As described above, in the semiconductor module 501 in which the frame 512 is fixed to the base plate 11 with the silver-based bonding material, the semiconductor may be broken due to the occurrence of the ion migration. Also, in recent years, wide gap semiconductors such as Gan, SiC, and $Ga_2O_3$ have been developed and put to practical use. Since a wide gap semiconductor has a high withstand voltage, performance of the semiconductor can be improved by increasing a power supply voltage to increase mobility or reducing a parasitic capacitance between the electrodes. On the other hand, in a wide gap semiconductor, since the electric field is strong, the above-described ion migration occurs easily. As described above, with the practical use of wide gap semiconductors, the above-described problems caused by ion migration may become more prominent.

In this regard, as shown in FIGS. 1 to 3, the semiconductor module 1 according to the embodiment includes the metal base plate 11, the insulating frame 12 provided on a peripheral edge portion of the base plate 11, and the metal lead 13 provided on the frame 12. In the semiconductor module having a semiconductor device 14 mounted on a base plate 11 in a space surrounded by a frame 12, the frame 12 is fixed to the base plate 11 by a bonding material 51 containing silver, the frame 12 has the concave portions 12a and 12b formed in the inner portion which is the corner portion on the space side and the outer portion which is a corner portion opposite to the inner portion in the surface thereof which faces the base plate 11, and the concave portions 12a and 12b are filled with the coating material 60.

In the semiconductor module 1 according to the embodiment, the concave portions 12a and 12b are formed in the corner portions (the inner and outer portions) of the surface (a surface to which the bonding material 51 containing silver is applied) of the frame 12 which faces the base, and the concave portions 12a and 12b are filled with the coating material 60. Since the coating material 60 is applied to the surface to which the bonding material 51 is applied, the surface of the silver included in the bonding material 51 can be physically pressed down, and the occurrence of ion migration can be curbed.

Figure 6:
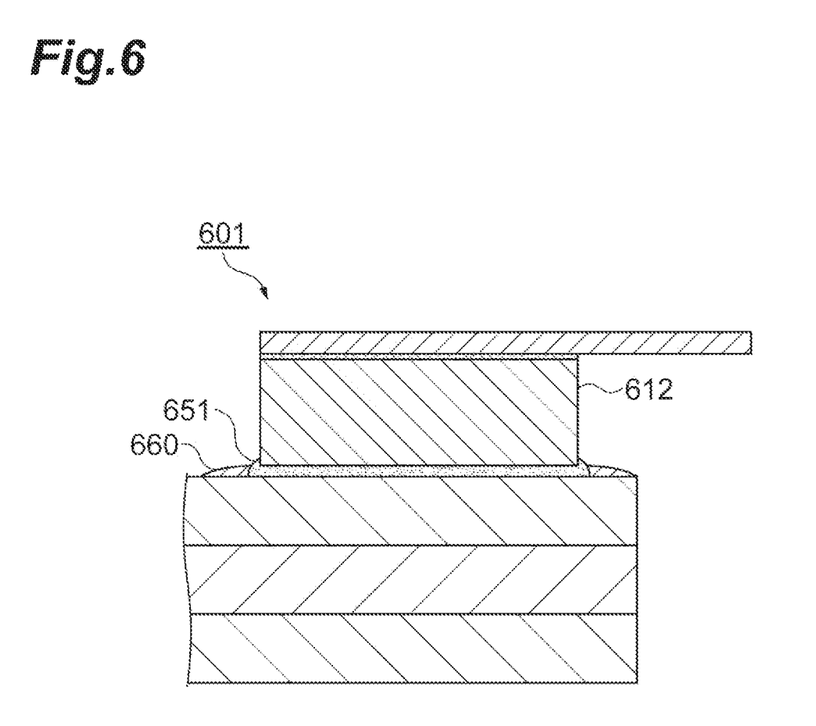
FIG. 6 is a cross-sectional view of a semiconductor module according to another comparative example.

Here, as a configuration for applying the coating material, a configuration of a semiconductor module 601 according to a comparative example shown in FIG. 6 can be considered. As shown in FIG. 6, in the semiconductor module 601, unlike the semiconductor module 1, the concave portion is not provided and a coating material 660 is simply applied to a flat surface of a frame 612. In such a configuration, there is no space to sufficiently store the coating material 660, the coating material 660 may not be able to be applied to a boundary surface between a bonding material 651 and the frame 612 without a gap, and thus there is a possibility that the ion migration may occur in the gap.

In this regard, in the semiconductor module 1 according to the embodiment, since the above-described concave portions 12a and 12b for storing (filling) the coating material 60 are formed, the coating material 60 flows easily, and the coating material 60 can be applied to the boundary surface between the bonding material 51 and the frame 12 without a gap. Thus, a surface of the bonding material 51 is covered with the coating material 60, and the occurrence of ion migration can be curbed more effectively. Also, since the concave portions 12a and 12b are provided, a distance between the bonding material 51 and the lead 13 can be increased, and thus it is possible to curb the occurrence of dendrites even when ion migration occurs.

In the semiconductor module 1 according to the embodiment, the coating material 60 is a thermoplastic coating material having a low dielectric constant. Due to the use of the thermoplastic coating material 60, the application and curing of the coating material 60 around the frame 12 can be easily performed. Further, due to the use of the coating material 60 having a low dielectric constant, it is possible to curb an influence of the coating material 60 on the high-frequency characteristics when the configuration of the embodiment is used for a package of a high-frequency semiconductor device.

In the semiconductor module 1 according to the embodiment, a depth and a height of each of the concave portions 12a and 12b are set to be 0.05 mm or more and 0.5 mm or less. Accordingly, the concave portions 12a and 12b which are filled with the coating material 60 can be appropriately formed in dimensions.

In the semiconductor module 1 according to the embodiment, the frame 12 may be made of a ceramic. Accordingly, the insulating frame 12 can be reliably formed with a simple configuration.

In the semiconductor module 1 according to the embodiment, the frame 12 may be made of a resin. Accordingly, an insulating frame can be reliably formed with a simple configuration.

In the semiconductor module 1 according to the embodiment, the semiconductor device may be configured to include a nitride semiconductor.

Figure 7:
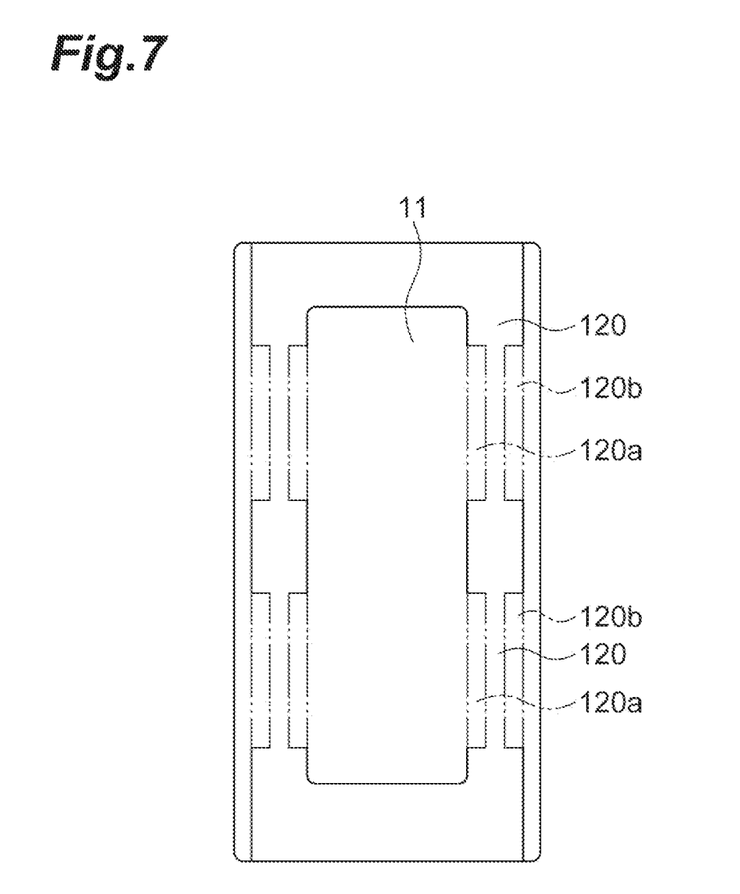
FIG. 7 is a view schematically showing a region in which a concave portion is formed in a semiconductor module according to a modified example.

Although the semiconductor module according to the embodiment has been described above, the present invention is not limited thereto, and various modifications can be applied. Also, the embodiments disclosed in the specification are to be considered in all respects as illustrative and not restrictive. The scope of the present invention is defined by the terms of the claims rather than the above description and is intended to include any modifications within the scope and meaning equivalent to the terms of the claims. For example, although the concave portions 12a and 12b have been described as being formed in substantially the entire region of the frame 12 in the longitudinal direction in the above-described semiconductor module 1 (refer to FIG. 4), the present invention is not limited thereto, and for example, as shown in FIG. 7, the concave portions 120a and 120b may be formed in a part of the frame 12 in the longitudinal direction. Specifically, in the example shown in FIG. 7, concave portions 120a and 120b are formed in only a portion of the inner portion and the outer portion of the frame 120 which overlap the leads in the stacking direction. Since the ion migration occurs in the region in which the leads are provided, the formation of the concave portions 120a and 120b only in the portion which overlaps the lead can minimize a formation region of the concave portion.

What is claimed is:

1. A semiconductor module comprising:
   a base made of a metal;
   an insulating frame provided on a peripheral edge portion of the base; and
   a semiconductor chip mounted on the base in a space surrounded by the frame, wherein
   the frame is fixed to the base by a bonding material containing silver,
   the frame has concave portions in a surface thereof which faces the base, the concave portions being formed in an inner portion of the frame which is a corner portion on a side of the space or an outer portion of the frame which is a corner portion on a side opposite to the inner portion, and
   the concave portions in the outer portion or the inner portion are filled with a protective material.

2. The semiconductor module according to claim 1, wherein the protective material is a thermoplastic resin.

3. The semiconductor module according to claim 2, wherein the protective material is a resin which is cured at a temperature of 150° C. or more and 230° C. or less.

4. The semiconductor module according to claim 2, wherein the protective material is a cycloolefin polymer resin.

5. The semiconductor module according to claim 1, wherein a dielectric constant of the protective material is 3.4 or more and 4.0 or less.

6. The semiconductor module according to claim 1, wherein
   the semiconductor module further comprises a lead made of metal and provided on the frame, and
   the concave portions are formed in only a portion of the inner portion or the outer portion which overlaps the lead in a stacking direction.

7. The semiconductor module according to claim 1, wherein a depth and a height of each of the concave portions are 0.05 mm or more and 0.5 mm or less.

8. The semiconductor module according to claim 1, wherein the frame is made of a ceramic.

9. The semiconductor module according to claim 8, wherein the ceramic is a material including an aluminum oxide.

10. The semiconductor module according to claim 1, wherein the frame is made of a resin.

11. The semiconductor module according to claim 10, wherein the resin is a polyimide resin.

12. The semiconductor module according to claim 1, wherein the semiconductor chip is configured to include a nitride semiconductor.

13. The semiconductor module according to claim 1, wherein
   the semiconductor module further comprises a lead made of metal and provided on the frame,
   the frame includes a multilayer substrate including at least two layers,
   the lead is a metal wiring provided on one layer of the multilayer substrate, and
   the one layer is drawn out of the space.

14. A semiconductor device container comprising:
   a base made of a metal; and
   an insulating frame provided on a peripheral edge portion of the base, wherein
   the frame is fixed to the base by a bonding material containing silver,
   the frame surrounds a space, the frame has concave portions in a surface thereof which faces the base, the concave portions being formed in an inner portion of the frame which is a corner portion on a side of the space or an outer portion of the frame which is a corner portion on a side opposite to the inner portion, and the concave portions in the outer portion or the inner portion are filled with a protective material.

\* \* \* \* \*